United States Patent
Fan et al.

(10) Patent No.: US 10,724,981 B2
(45) Date of Patent: Jul. 28, 2020

(54) MICROFLUIDIC CHIP AND MANUFACTURING METHOD THEREOF AND INTEGRATED MICROFLUIDIC CHIP SYSTEM

(71) Applicant: National Taiwan University, Taipei (TW)

(72) Inventors: Shih-Kang Fan, Taipei (TW); Chih-Yuan Liang, Taipei (TW); Chia-Chann Shiue, Taipei (TW); Yuan-Sheng Lee, Taipei (TW); Yu-Kai Lai, Taipei (TW)

( * ) Notice: Subject to any disclaimer, the term of this patent is extended or adjusted under 35 U.S.C. 154(b) by 0 days.

(21) Appl. No.: 15/964,009

(22) Filed: Apr. 26, 2018

(65) Prior Publication Data

US 2019/0113475 A1 Apr. 18, 2019

(30) Foreign Application Priority Data

Oct. 13, 2017 (TW) .............................. 106135218 A

(51) Int. Cl.
  *G01N 27/327* (2006.01)
  *B01L 3/00* (2006.01)
  *H01L 21/02* (2006.01)

(52) U.S. Cl.
  CPC .... *G01N 27/3272* (2013.01); *B01L 3/502707* (2013.01); *B01L 3/502753* (2013.01);
  (Continued)

(58) Field of Classification Search
  CPC ........... G01N 27/4145; G01N 27/4148; G01N 27/3272; B01L 3/502707; B01L 3/502753; B01L 3/502792
  See application file for complete search history.

(56) References Cited

U.S. PATENT DOCUMENTS 9,223,317 B2 12/2015 Winger
9,389,199 B2 7/2016 Cheng et al.
(Continued)

FOREIGN PATENT DOCUMENTS

CN 102313765 1/2012
CN 105977282 9/2016
(Continued)

OTHER PUBLICATIONS

Sung Kwon Cho, et al., "Creating, Transporting, Cutting, and Merging Liquid Droplets by Electrowetting-Based Actuation for Digital Microfluidic Circuits," Journal of Microelectromechanical Systems, vol. 12, No. 1, Feb. 2003, pp. 70-80.
(Continued)

*Primary Examiner* — Sue A Purvis
*Assistant Examiner* — Scott Stowe
(74) *Attorney, Agent, or Firm* — Che-Yang Chen; Law Office of Michael Chen

(57) ABSTRACT

A microfluidic chip suitable for detecting a microdroplet includes a first component, a second component, a channel layer, and a semiconductor chip. The first component includes a first substrate, a first electrode layer, and a first dielectric layer, wherein the first electrode layer is located between the first substrate and the first dielectric layer. The second component is disposed opposite to the first component and includes a second substrate, a second electrode layer, and a second dielectric layer. The channel layer is located between the first component and the second component. The semiconductor chip is disposed at one side of the first substrate and is exposed to the channel layer to assist in treating or detecting a sample or microdroplet. The microdroplet in the sample entering the channel layer is reacted with the semiconductor chip, and thus the sample is detected.

18 Claims, 16 Drawing Sheets

(52) U.S. Cl.
CPC .. *B01L 3/502792* (2013.01); *H01L 21/02194* (2013.01); *B01L 2200/10* (2013.01); *B01L 2300/0645* (2013.01); *B01L 2300/0816* (2013.01); *B01L 2400/0427* (2013.01)

(56) References Cited

U.S. PATENT DOCUMENTS

| | | | |
|---|---|---|---|
| 9,459,234 | B2 | 10/2016 | Kalnitsky et al. |
| 2016/0178568 | A1* | 6/2016 | Cheng ................ G01N 27/4145 257/253 |

FOREIGN PATENT DOCUMENTS

| | | |
|---|---|---|
| TW | I384566 | 2/2013 |
| TW | I385376 | 2/2013 |
| TW | I557409 | 11/2016 |
| TW | I565946 | 1/2017 |

OTHER PUBLICATIONS

Jie-Long He, et al., "Opto-Microfluidic Immunosensors: From Colorimetric to Plasmonic," Micromachines, vol. 7, Feb. 15, 2016, pp. 1-18.

* cited by examiner

MICROFLUIDIC CHIP AND MANUFACTURING METHOD THEREOF AND INTEGRATED MICROFLUIDIC CHIP SYSTEM

CROSS-REFERENCE TO RELATED APPLICATION

This application claims the priority benefit of Taiwan application serial no. 106135218, filed on Oct. 13, 2017. The entirety of the above-mentioned patent application is hereby incorporated by reference herein and made a part of this specification.

BACKGROUND OF THE INVENTION

Field of the Invention

The invention relates to a microfluidic chip and a manufacturing method thereof and an integrated microfluidic chip system, and more particularly, to a microfluidic chip including a semiconductor chip and a manufacturing method thereof and an integrated microfluidic chip system.

Description of Related Art

Microfluidics has features such as small amount of required samples, small chip size for detection, rapid detection, and low energy consumption, and is therefore extensively applied in various areas such as chemistry, engineering experiments, and biochemistry. In recent years, with the rapid development of biotechnology and the medical trend of increased demand in preventive medicine, early diagnosis, or point of care, a microfluidic chip made by a microelectromechanical system and a microfluidic system technique has gained much attention.

The traditional sample for biosensing or bioanalysis has a large volume, a large amount of reagent is needed for detection, and the time needed for detection is long, but a microfluidic chip system on the other hand can be used in a small chip, and therefore the application of the microfluidic chip system in the in vitro detection market has considerable advantages and potential. However, the detection of disease often requires the detection of a plurality of biomarkers or biological signals at the same time. Therefore, how to build a new microfluidic chip and a system thereof to integrate microfluidics and biosensing to detect a plurality of compounds, biomarkers, or biological signals at the same time to achieve the objects of few sample requirements, rapid detection, and simultaneous detection is an important topic.

SUMMARY OF THE INVENTION

The invention provides a microfluidic chip for detecting or treating a microdroplet and a manufacturing method of the microfluidic chip for manufacturing a microfluidic chip. The integrated microfluidic chip technique thereof can be used with a semiconductor chip to detect a compound, biomarker, or biological signal in the microdroplet.

The invention further provides an integrated microfluidic chip system for sensing a plurality of compounds, biomarkers, or biological signals at the same time, and therefore the system has the advantages of few sample requirements, rapid detection, and simultaneous detection.

The invention provides a microfluidic chip for detecting or treating a microdroplet. The microfluidic chip includes a first component, a second component, a channel layer, and a semiconductor chip. The first component includes a first substrate, a first electrode layer, and a first dielectric layer, wherein the first electrode layer is located between the first substrate and the first dielectric layer. The second component is disposed opposite to the first component and includes a second substrate, a second electrode layer, and a second dielectric layer, wherein the second electrode layer is located between the second substrate and the second dielectric layer. The channel layer is located between the first component and the second component and includes at least one channel. The semiconductor chip is disposed at one side of the first substrate and is exposed to the channel layer. The microdroplet entering the channel layer is reacted with the semiconductor chip.

In an embodiment of the invention, the first dielectric layer has a first opening, and the semiconductor chip is exposed to the channel layer via the first opening, and the microdroplet entering the channel layer is reacted with the semiconductor chip via the first opening.

In an embodiment of the invention, the first component further includes a third dielectric layer having a second opening. The third dielectric layer is disposed between the first electrode layer and the first substrate, and the semiconductor chip is disposed in the second opening and located on the first substrate.

In an embodiment of the invention, the height of the third dielectric layer and the height of the semiconductor chip are substantially the same.

In an embodiment of the invention, the first component further includes a polymer layer having a third opening. The polymer layer is disposed between the first electrode layer and the third dielectric layer and filled in a gap between the third dielectric layer and the semiconductor chip, and the semiconductor chip is exposed to the channel layer via the third opening.

In an embodiment of the invention, the first substrate includes a first via, wherein the semiconductor chip is disposed below the first substrate and is exposed to the channel layer via the first via.

In an embodiment of the invention, the semiconductor chip is fixed below the first substrate via the signal conduction layer and surrounded by the polymer layer.

In an embodiment of the invention, the first electrode layer is a patterned electrode, and the patterned electrode includes a plurality of electrodes, wherein one of the electrodes located above the semiconductor chip and one of the electrodes not located above the semiconductor chip have different sizes.

In an embodiment of the invention, the microfluidic chip further includes a signal conduction layer having an electrical conduction function and used as an electrical conduction layer of the semiconductor chip and the first component; a polymer layer having a function of fixing the semiconductor chip on the first component; and a blocking layer located at one side of the semiconductor chip and having a function of preventing a material in the signal conduction layer or the polymer layer from contaminating a detection location of the semiconductor chip, wherein the polymer layer and the signal conduction layer are located at a same side of the blocking layer.

In an embodiment of the invention, the first component comprises a flexible circuit board or a member formed by a circuit board and an ITO conductive glass.

In an embodiment of the invention, the first component further comprises a carrier board and a flexible circuit layer disposed on the carrier board.

The invention provides a manufacturing method of a microfluidic chip including the following steps. A first component is provided, wherein the first component includes a first substrate, a first electrode layer, and a first dielectric layer having a first opening, and the first electrode layer is located between the first substrate and the first dielectric layer. A second component is provided, wherein the second component includes a second substrate, a second electrode layer, and a second dielectric layer, and the second electrode layer is located between the second substrate and the second dielectric layer. The first component and the second component are disposed opposite to each other, and a channel layer is formed between the first component and the second component. A semiconductor chip is disposed at one side of the first substrate, wherein the semiconductor chip is exposed to the channel layer via the first opening.

In an embodiment of the invention, the step of providing the first component and disposing the semiconductor chip includes the following steps. A third dielectric layer having a second opening is formed on the first substrate. The semiconductor chip is disposed in the second opening on the first substrate. A polymer layer having a third opening is formed on the third dielectric layer, wherein the polymer layer is filled in a gap between the third dielectric layer and the semiconductor chip, and the third opening exposes the semiconductor chip. A first electrode layer is formed on the polymer layer. A first dielectric layer is formed on the first electrode layer, wherein the first opening exposes the semiconductor chip.

In an embodiment of the invention, the step of providing the first component and disposing the semiconductor chip includes the following steps. A third dielectric layer having a second opening and a plurality of grooves is formed on the first substrate. A first electrode layer is formed in the grooves. The first dielectric layer having the first opening is formed on the third dielectric layer to cover the first electrode layer. A protective layer having a fourth opening is formed on the first dielectric layer, wherein the protective layer covers the first dielectric layer and the fourth opening exposes the third opening. The semiconductor chip is disposed in the first opening on the first substrate. A surface modification layer is formed on the surface of the semiconductor chip, and the protective layer is removed after surface modification.

In an embodiment of the invention, a method of disposing the semiconductor chip in the first opening on the first substrate includes attaching the first substrate on the third dielectric layer via the signal conduction layer.

In an embodiment of the invention, a method of disposing the semiconductor chip in the first opening on the first substrate includes fixing the semiconductor chip in the first opening by using a curable adhesive as the first substrate.

In an embodiment of the invention, the step of providing the first component and disposing the semiconductor chip includes the following steps. The first substrate having a first via is provided. The semiconductor chip is fixed below the first via of the first substrate via a signal conduction layer, wherein the semiconductor chip is exposed via the first via. The first electrode layer is formed on the first substrate. The first dielectric layer is formed on the first substrate, wherein the first opening exposes the semiconductor chip.

In an embodiment of the invention, the manufacturing method of the microfluidic chip further includes surrounding the semiconductor chip by a polymer layer.

The invention provides an integrated microfluidic chip system having at least one storage region, one flow region, and one detection region, wherein the storage region is for storing a sample or a reagent, and the channel region is located between the storage region and the detection region. The integrated microfluidic chip system includes a first component, a second component, a channel layer, a semiconductor chip, and a waste liquid region. The first component includes a first substrate, a first electrode layer, and a first dielectric layer having a first opening, wherein the first electrode layer is located between the first substrate and the first dielectric layer. The second component is disposed opposite to the first component and includes a second substrate, a second electrode layer, and a second dielectric layer, wherein the second electrode layer is located between the second substrate and the second dielectric layer. The channel layer is located in the channel region and located between the first component and the second component such that the sample or the reagent in the storage region enters the detection region via the channel region. The semiconductor chip is located in the detection region and disposed at one side of the first substrate and is exposed to the channel layer via the first opening. The microdroplet entering the channel layer is reacted with the semiconductor chip via the first opening. The waste liquid region is adjacent to the detection region for collecting the sample or the reagent from the detection of the semiconductor chip.

In an embodiment of the invention, the integrated microfluidic chip system further includes a buffer region, wherein the buffer region is located between the storage region and the channel region for mixing the sample and the reagent.

Based on the above, in the invention, a microfluidic chip technique and a semiconductor chip are integrated such that a microdroplet can be driven to flow toward a semiconductor chip by a first electrode layer to detect a compound, biomarker, or biological signal of the microdroplet via the semiconductor chip. Moreover, the invention further provides an integrated microfluidic chip system including a plurality of microchannels and at least one semiconductor chip to detect a plurality of compounds, biomarkers, or biological signals at the same time to achieve the effects of few sample requirements, rapid detection, and simultaneous detection.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following, the embodiments of the invention are described in detail. However, the embodiments are exemplary, and the invention is not limited thereto.

Figure 1A:
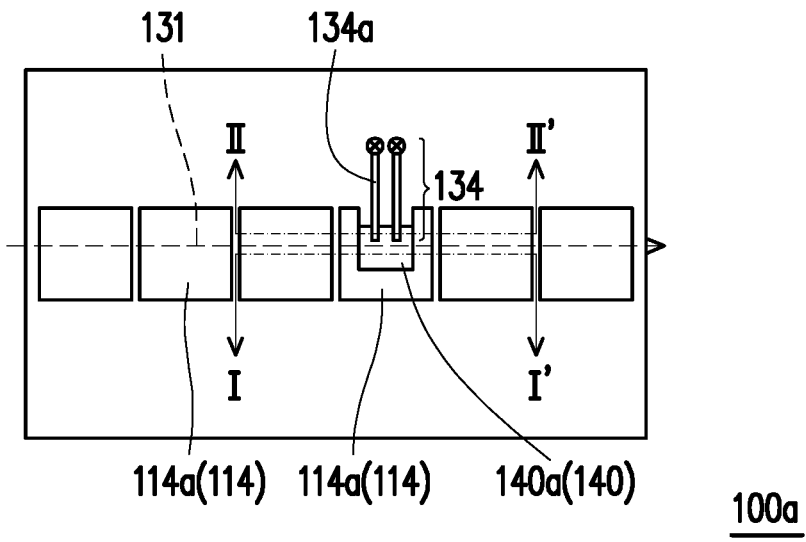
FIG. 1A shows a top view of a microfluidic chip without other members such as the second component in an embodiment of the invention.
Figure 1B:
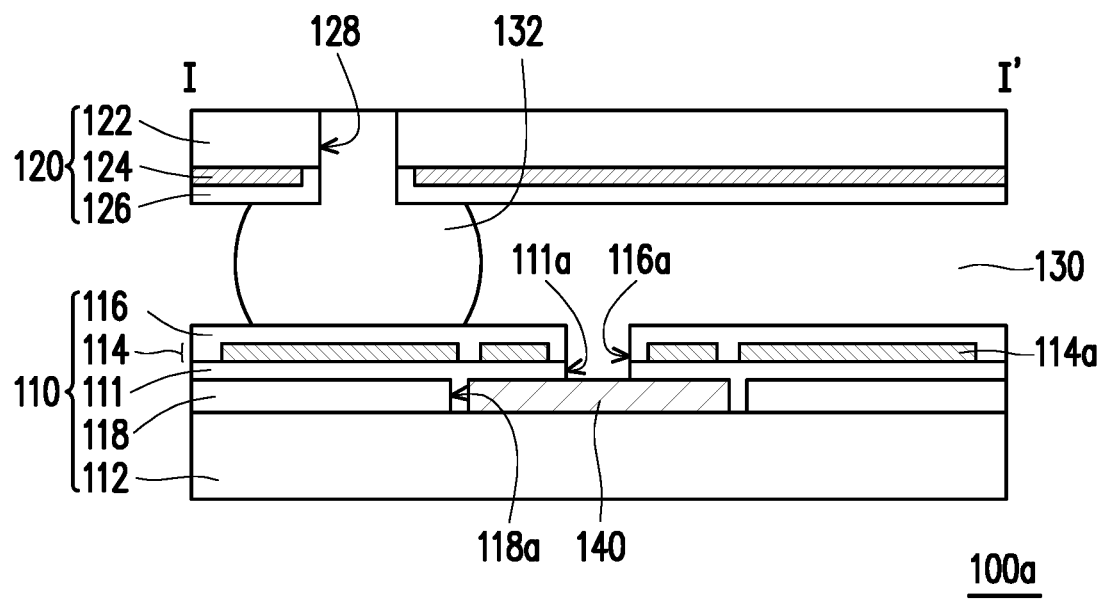
FIG. 1B shows a cross section of I-I' in FIG. 1A.
Figure 1C:
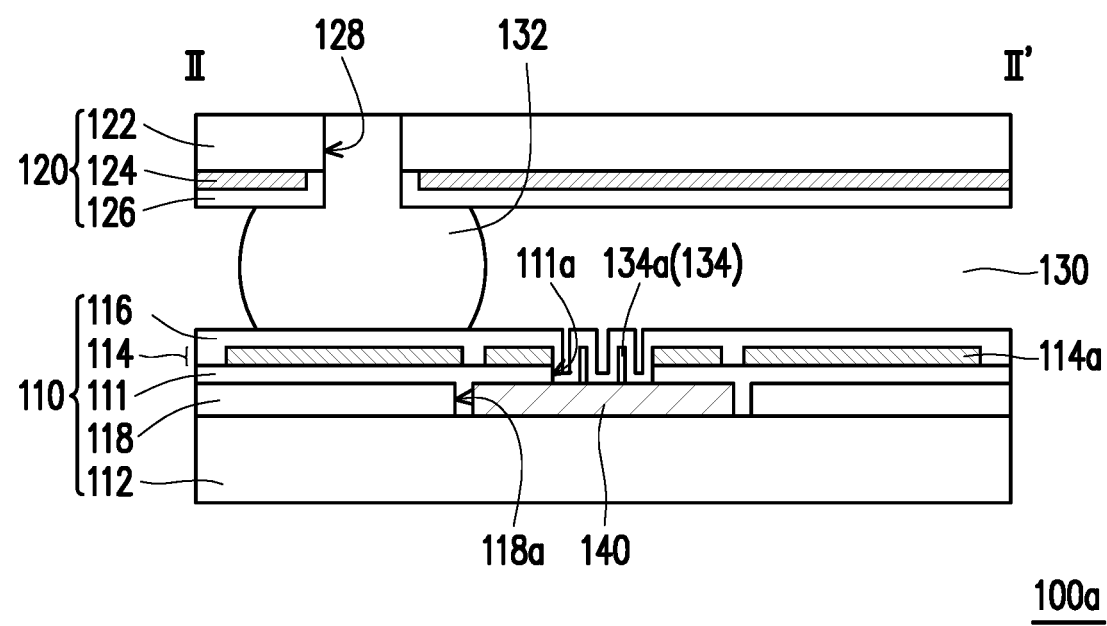
FIG. 1C shows a cross section of II-II' in FIG. 1A.

FIG. 1A shows a top view of a microfluidic chip without other members such as the second component in an embodiment of the invention, FIG. 1B shows a cross section of I-I' in FIG. 1A, and FIG. 1C shows a cross section of II-II' in FIG. 1A. In particular, FIG. 1B and FIG. 1C show pattern designs of a first electrode layer and a signal conduction layer, and other members such as a second component 120 are omitted in FIG. 1A.

Referring to all of FIG. 1A, FIG. 1B, and FIG. 1C, a microfluidic chip 100a of the present embodiment is suitable for detecting a microdroplet 132 and includes a first component 110, a second component 120, a channel layer 130, and a semiconductor chip 140. The first component 110 includes a first substrate 112, a first electrode layer 114, a signal conduction layer 134, and a first dielectric layer 116 having a first opening 116a, wherein the first electrode layer 114 and the signal conduction layer 134 are located between the first substrate 112 and the first dielectric layer 116.

The second component 120 and the first component 110 are disposed opposite to each other. The second component 120 includes a second substrate 122, a second electrode layer 124, and a second dielectric layer 126, wherein the second electrode layer 124 is located between the second substrate 122 and the second dielectric layer 126. The channel layer 130 is located between the first component 110 and the second component 120. The semiconductor chip 140 is disposed at one side of the first substrate 112 and is exposed to the channel layer 130 via the first opening 116a. Specifically, the semiconductor chip 140 has a detection region 140a and is exposed to the channel layer 130 via the first opening 116a of the first dielectric layer 116 to be in contact with the microdroplet 132. The microdroplet 132 can enter the channel layer 130 from a second via 128 of the second component 120 and be reacted with the semiconductor chip 140 via the first opening 116a to generate a signal difference to detect the sample, or different signal strengths are generated by the semiconductor chip 140 due to different amounts of the analyte in the microdroplet 132 to detect the sample. In the present embodiment, the second via 128 passes through, for instance, the second substrate 122, the second electrode layer 124, and the second dielectric layer 126 of the second component 120 to be connected to the channel layer 130.

In the present embodiment, as shown in FIG. 1B and FIG. 1C, the first component 110 further includes, for instance, a third dielectric layer 118 having a second opening 118a. The third dielectric layer 118 is, for instance, disposed between the first electrode layer 114 and the first substrate 112, and the semiconductor chip 140 is, for instance, disposed in the second opening 118a at one side of the first substrate 112. The third dielectric layer 118 is, for instance, disposed between the signal conduction layer 134 and the first substrate 112, and the semiconductor chip 140 is, for instance, disposed in the second opening 118a at one side of the first substrate 112. In other words, the semiconductor chip 140 is disposed in the first component 110. In the present embodiment, the size of the second opening 118a is, for instance, greater than or equal to that of the semiconductor chip 140. The height of the third dielectric layer 118 and the height of the semiconductor chip 140 are substantially the same.

In the present embodiment, the first component 110 further includes, for instance, a polymer layer 111 having a third opening 111a. The polymer layer 111 is disposed between the first electrode layer 114 and the third dielectric layer 118 and is, for instance, filled in a gap between the third dielectric layer 118 and the semiconductor chip 140. In particular, the third opening 111a exposes the semiconductor chip 140 such that the semiconductor chip 140 is exposed to the channel layer 130. In the present embodiment, the material of the polymer layer 111 is, for instance, poly (methyl methacrylate) (PMMA), polycarbonate (PC), polydimethylsiloxane (PDMS), epoxy resin, or other suitable packaging materials, and the thickness thereof is, for instance, 5 μm to 20 μm.

Referring to all of FIG. 1A, FIG. 1B, and FIG. 1C, the channel layer 130 is formed between the first electrode layer 114 and the second electrode layer 124, and the channel layer 130 includes a plurality of or at least one channel 131. In the present embodiment, the first electrode layer 114 is, for instance, a patterned electrode layer including a single or a plurality of electrodes 114a, and the material thereof is, for instance, a conductive material including a metal such as chromium, silver, gold, or copper or a metal oxide such as indium tin oxide, but the invention is not limited thereto. In the present embodiment, the signal conduction layer 134 can include a plurality of electrodes 134a electrically connected to the semiconductor chip 140 and having electrical conduction function. Specifically, the electrodes 134a can be connection wires or connection pads for connecting the semiconductor chip 140 to an external electrical signal, control circuit, light-sensing circuit, electrical sensing circuit, or signal output terminal such that the semiconductor chip 140 is conducted to outside device, but the invention is not limited thereto. In the present embodiment, 2 electrodes 134a are schematically shown as an example, but the invention is not limited thereto, i.e., in other embodiments, the signal conduction layer 134 includes 1 or more than 2 electrodes 134a. In the present embodiment, the material of the signal conduction layer 134 is, for instance, a conductive material including a metal such as chromium, silver, gold, or copper or a metal oxide such as indium tin oxide, but the invention is not limited thereto.

In the present embodiment, the arrangement of the electrodes 114a defines the path of the channel 131 of the channel layer 130 to control the flow and direction of the microdroplet 132. In the present embodiment, the first electrode layer 114 is, for instance, further extended and disposed on the exposed side surface of the third opening 111a to facilitate the microdroplet 132 to flow toward the semiconductor chip 140. It should be mentioned that, although in the present embodiment, each of the electrodes 114a of the first electrode layer 114 has a different size and the electrodes 114a are spaced apart by different distances, the invention is not limited thereto. In other words, in other embodiments, the electrodes 114a of the first electrode layer 114 can have other arrangements and sizes. In an embodiment, the first electrode layer is a patterned electrode layer formed by a plurality of electrodes and an electrode having an opening at middle or peripheral to expose the semiconductor chip which controls the droplet.

In the present embodiment, the first dielectric layer 116 covers, for instance, the first electrode layer 114 and is filled in the gap between the electrodes 114a of the first electrode layer 114. In the present embodiment, the first dielectric layer 116 covers, for instance, the signal conduction layer 134 and is filled in the gap in the periphery of the electrodes 134a of the signal conduction layer 134 and covers the region between the first electrode layer 114 and the signal conduction layer 134. Moreover, the first dielectric layer 116 can further be extended and disposed on the first electrode layer 114 located on the sidewall of the third opening 111a and the signal conduction layer 134 to completely prevent the first electrode layer 114 and the signal conduction layer 134 from being exposed to avoid an electrolysis reaction.

In the present embodiment, the semiconductor chip 140 can be a silicon photomultiplier, photodiode, avalanche photodiode (APD), CMOS image sensor, CCD image sensor, impedance sensor, capacitive sensor, current sensor, voltage sensor, magnetic field sensor, Hall sensor, or other suitable sensors. In the present embodiment, the surface of the semiconductor chip 140 can have a surface modification layer (not shown).

It should be mentioned here that, the following embodiments adopt the reference numerals of the embodiments above and a portion of the contents thereof, wherein the same reference numerals are used to represent the same or similar devices and descriptions of the same technical contents are omitted. The omitted portions are as described in the embodiments above and are not repeated in the embodiments below.

Figure 2A:
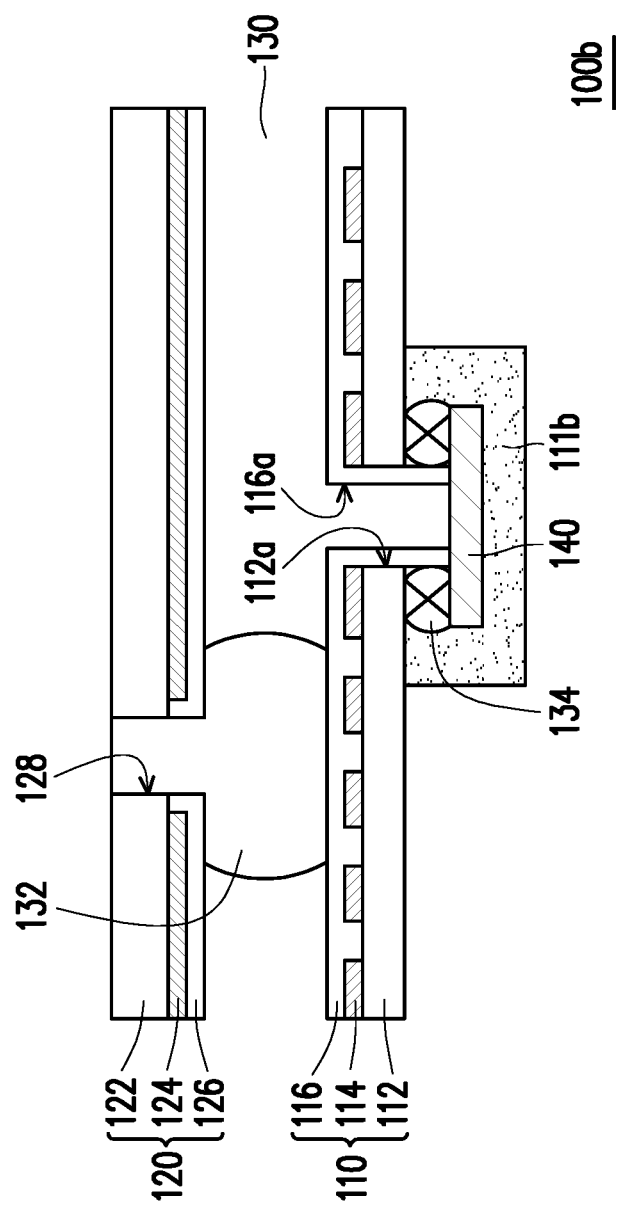
FIG. 2A shows a cross section of a microfluidic chip of another embodiment of the invention.

FIG. 2A shows a cross section of a microfluidic chip of another embodiment of the invention. The members of the microfluidic chip of the present embodiment are similar to the members of the microfluidic chip of FIG. 1B, and the main difference between the two is that the semiconductor chip is fixed at another side of the first substrate.

Referring to FIG. 2A, a microfluidic chip 100b includes a first component 110 and a second component 120 disposed opposite to each other, a channel layer 130 located between the first component 110 and the second component 120, and a semiconductor chip 140. In the present embodiment, the first component 110 includes a first substrate 112, a first electrode layer 114, and a first dielectric layer 116. The first substrate 112, for instance, includes a first via 112a, and the first via 112a is connected to the channel layer 130. The first electrode layer 114 is disposed on the first substrate 112. In the present embodiment, the semiconductor chip 140 is, for instance, fixed on the lower surface of the first substrate 112 via the signal conduction layer 134 and exposed to the channel layer 130 via the first via 112a, the signal conduction layer 134 can further have electrical conduction function, and the material thereof is, for instance, a metal such as gold, silver, copper, tin, or chromium, a conductive polymer, or a common conductive adhesive, but the invention is not limited thereto. In the present embodiment, the first component 110 can further include a polymer layer 111b surrounding the semiconductor chip 140. In the present embodiment, the first dielectric layer 116 covers, for instance, the first electrode layer 114 and is extended and disposed on the sidewall of the first via 112a of the first substrate 112, and the first opening 116a of the first dielectric layer 116 exposes the semiconductor chip 140. In the present embodiment, the microdroplet 132 can enter the channel layer 130 from the second via 128 of the second component 120 and is reacted with the semiconductor chip 140 via the first opening 116a to generate a signal difference to detect the sample, or different signal strengths are generated by the semiconductor chip 140 due to different amounts of the analyte in the microdroplet 132 to detect the sample.

Figure 2B:
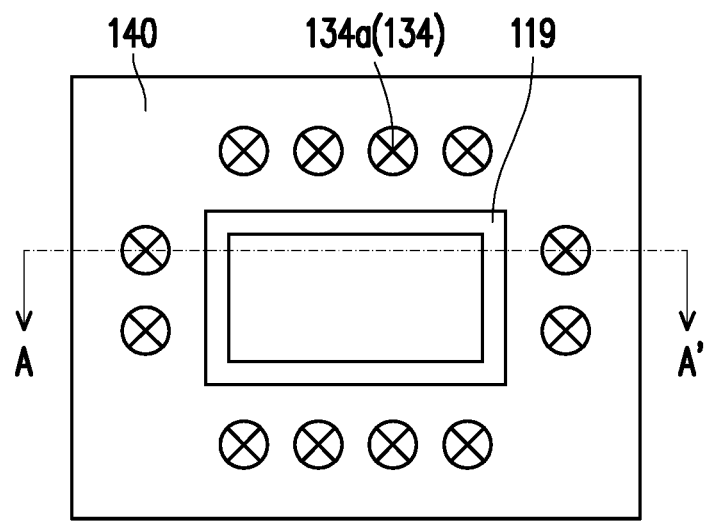
FIG. 2B shows a top view of a semiconductor chip of another embodiment of the invention.

FIG. 2B shows a top view of a semiconductor chip of another embodiment of the invention. Referring to FIG. 2B, in the present embodiment, the semiconductor chip 140 includes a signal conduction layer 134 and a blocking layer 119, wherein the signal conduction layer 134 can include one or a plurality of electrodes 134a. The semiconductor chip 140 can be fixed, for instance, at a side of the first substrate 112 in the first component 110 via the electrodes 134a of the signal conduction layer 134 (as shown in FIG. 2A) or fixed on the carrier board of a circuit board, flexible circuit board, or other polymer materials, the signal conduction layer 134 can further have electrical conduction function, and the material thereof is, for instance, a metal such as gold, silver, copper, tin, or chromium, a conductive polymer or common conductive adhesive, but the invention is not limited thereto.

Figure 2C:
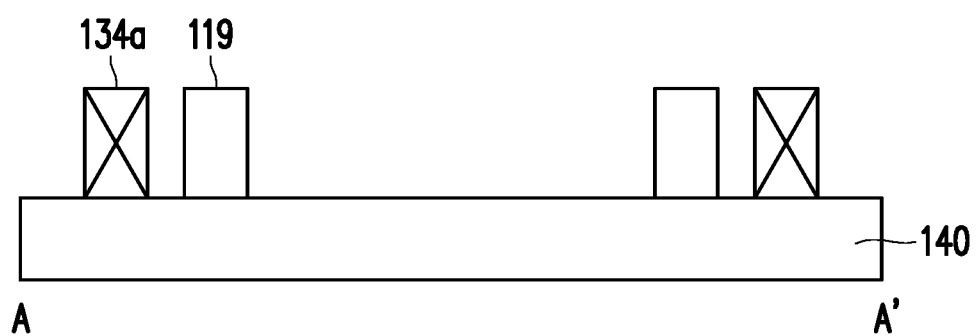
FIG. 2C shows a cross section of A-A' in FIG. 2B.

FIG. 2C is a cross section of A-A' in FIG. 2B, and in the present embodiment, the height of the blocking layer 119 is the same as or greater than the height of the signal conduction layer 134, and the function thereof is to prevent contamination or coverage to the surface of the semiconductor chip 140 during the integration process of the chip and affecting the detection of the sample. In the present embodiment, the blocking layer 119 can prevent the polymer layer 111b from flowing to the surface of the semiconductor chip 140 before curing during the covering process of the semiconductor chip 140 to prevent contamination or coverage to the subsequent detection location in which the droplet 132 comes in contact with the surface of the semiconductor chip 140. In the present embodiment, the material of the blocking layer 119 is, for instance, photoresist, poly(methyl methacrylate) (PMMA), polycarbonate (PC), polydimethylsiloxane (PDMS), epoxy resin, UV adhesive, or other curable patterned materials.

Figure 2D:
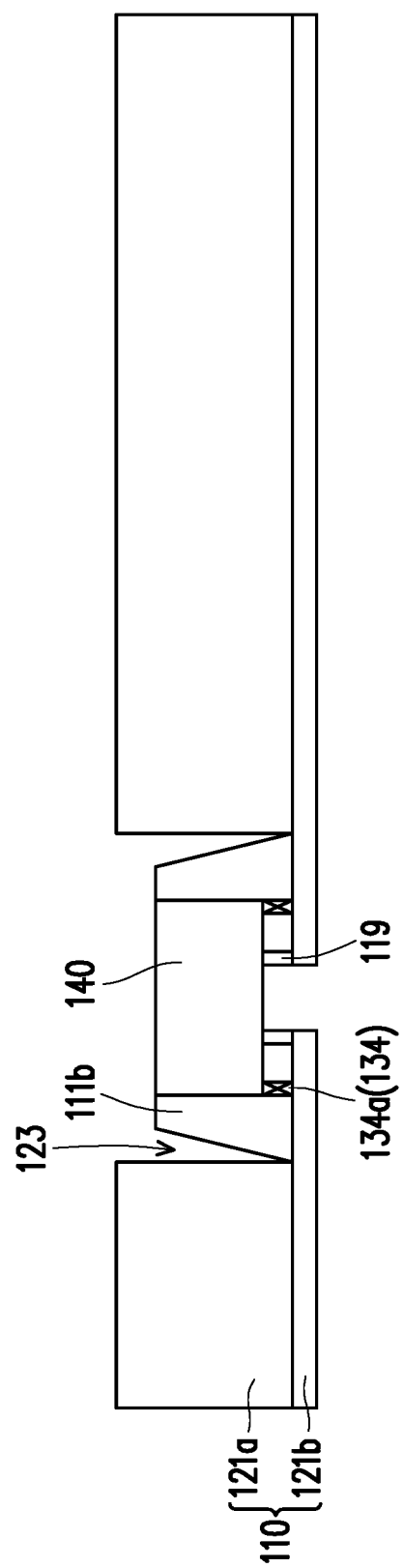
FIG. 2D shows a cross section of a microfluidic chip and a semiconductor chip integrated system of another embodiment of the invention.

FIG. 2D shows a cross section of a microfluidic chip and a semiconductor chip integrated system of another embodiment of the invention. Referring to FIG. 2D, in the present embodiment, the microfluidic chip further contains a first component 110 and a second component (not shown), wherein the integration of the first component 110 and the semiconductor chip 140 is, for instance, fixed to one side of the first component 110 via the signal conduction layer 134. In the present embodiment, the first component 110 is, for instance, a flexible circuit board or a member formed by a regular circuit board and an ITO conductive glass. Specifically, the first component 110 is, for instance, a flexible circuit layer 121b or includes a carrier board 121a and a flexible circuit layer 121b disposed on the carrier board 121a. In the present embodiment, the signal conduction layer 134 can further have electrical conduction function, and the material thereof is, for instance, a metal such as gold, silver, copper, tin, or chromium, a conductive polymer, or a common conductive adhesive, but the invention is not limited thereto. In the present embodiment, the first component 110 can further include a blocking layer 119 surrounding a side of the semiconductor chip 140 and located inside the signal conduction layer 134, and thus it is not affected that the semiconductor chip 140 is fixed to one side of the first component 110, a circuit board or the carrier board of other polymer materials via the signal conduction layer 134 or the polymer layer 111b. In the present embodiment, the semiconductor chip 140 is, for instance, disposed in the opening of the carrier board 121a and connected to the flexible circuit layer 121b, wherein signal conduction between the semiconductor chip 140 and the flexible circuit layer 121b is established via the signal conduction layer 134. In the present embodiment, in addition to being fixed via the signal conduction layer 134, the semiconductor chip 140 can also be fixed or hot pressed at one side of the first component 110, a circuit board or a carrier of other polymer materials via the signal conduction layer 134 or the method of generating the polymer layer 111 above by injecting a polymer layer 111b between the carrier board 121a and the chip after the semiconductor chip 140 is combined with the first component 110. In the present embodiment, the material of the carrier board 121a can be, for instance, glass, rigid circuit board, flexible circuit board, or plastic polymer, but the invention is not limited thereto. In the present embodiment, the function of the carrier board 121a can be a support carrier to increase the surface flatness of the first component 110. In the present embodiment, the polymer layer 111b can be formed by the polymerization of a molecule or a polymer, and the polymerization process can be photopolymerization, thermal polymerization, chemical polymerization, or other methods that can form the solid polymer layer 111b to fix the semiconductor chip 140. In the present embodiment, the material of the polymer layer 111b is, for instance, poly(methyl methacrylate) (PMMA), polycarbonate (PC), polydimethylsiloxane (PDMS), epoxy resin, UV adhesive, curable adhesive, or other suitable packaging materials, but the invention is not limited thereto.

In the above embodiments, an electrode technique is applied in a channel layer design to control the flow and direction of the microdroplet in the channel layer via the pattern and arrangement of the first electrode layer, and thus the dripped microdroplet can reach the surface of the semiconductor chip. Accordingly, the compound, biomarker, or biological signal in the microdroplet can be detected. Moreover, since an electrode technique and a microfluidic chip technique are integrated, the microfluidic chip of the present embodiment also has advantages such as few sample requirements and rapid detection.

FIG. 3A to FIG. 3D show cross sections of the manufacturing method of a microfluidic chip of an embodiment of the invention. FIG. 4A shows a top view of FIG. 3A without the polymer layer 117. FIG. 4B shows a top view of FIG. 3B without the polymer layer.

Figure 3A:
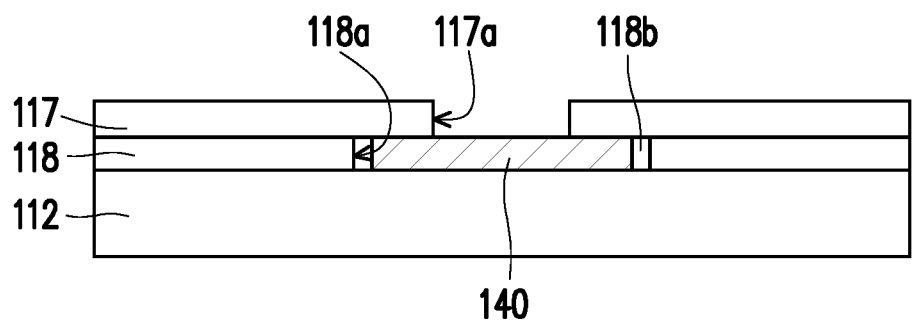
FIG. 3A to FIG. 3D show cross sections of the manufacturing method of a microfluidic chip of an embodiment of the invention.
Figure 3B:
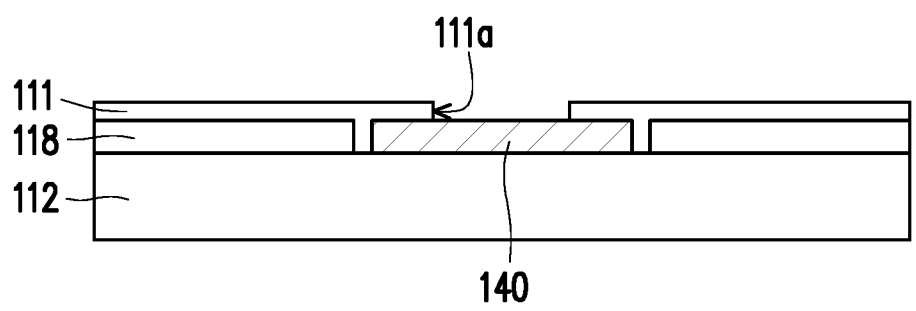
Figure 4A:
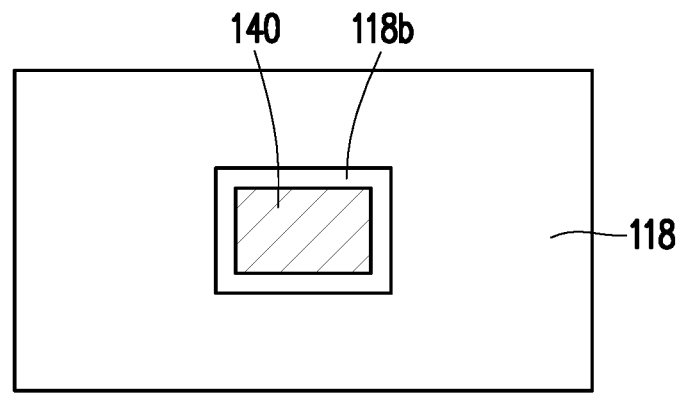
FIG. 4A shows a top view of FIG. 3A without the polymer layer.
Figure 4B:
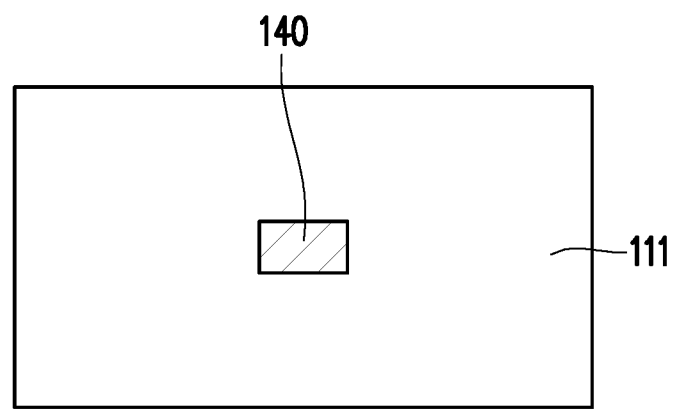
FIG. 4B shows a top view of FIG. 3B without the polymer layer.

Referring to FIG. 3A, FIG. 3B, FIG. 4A, and FIG. 4B, a first component 110 is provided. In the present embodiment, as shown in FIG. 3A and FIG. 4A, FIG. 4A shows a top view of FIG. 3A without the polymer layer 117, a third dielectric layer 118 having a second opening 118a is first formed on a first substrate 112. Next, the semiconductor chip 140 is disposed in the second opening 118a on the first substrate 112. Next, a polymer layer 117 is formed on the third dielectric layer 118, and the polymer layer 117 has an opening 117a exposing a portion of the semiconductor chip 140. Then, as shown in FIG. 3B and FIG. 4B, a process such as thermoforming is performed on the polymer layer 117 such that the polymer layer 117 is filled in a gap 118b between the third dielectric layer 118 and the semiconductor chip 140 to form a polymer layer 111. In the present embodiment, the polymer material is, for instance, a liquid or solid molecule, and the polymer material is polymerized into a solid state after a photo or thermal process or other chemical catalysis; the polymer material can also be, for instance, poly(methyl methacrylate) (PMMA), polycarbonate (PC), polydimethylsiloxane (PDMS), epoxy resin, or other suitable packaging material solid polymers, and is thermoformed after heat treatment to be filled in the gap between the third dielectric layer 118 and the semiconductor chip 140.

Figure 3C:
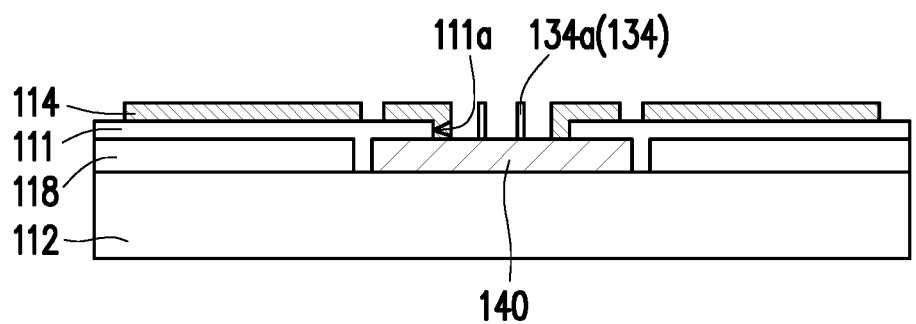

Referring to FIG. 3C, next, a first electrode layer 114 and a signal conduction layer 134 are formed on the polymer layer 111. In the present embodiment, the forming method of the first electrode layer 114 and the signal conduction layer 134 is, for instance, electroplating, evaporation, sputtering, coating, wire bonding, or other suitable processes. In the present embodiment, the forming method of the first electrode layer 114 further includes patterning the resulting electrode layer such that the first electrode layer 114 includes a plurality of electrodes with a desired arrangement. In the present embodiment, the forming method of the signal conduction layer 134 further includes patterning the resulting electrode layer such that the signal conduction layer 134 has an electrode 134a needed for the signal conduction of the semiconductor chip 140.

Figure 3D:
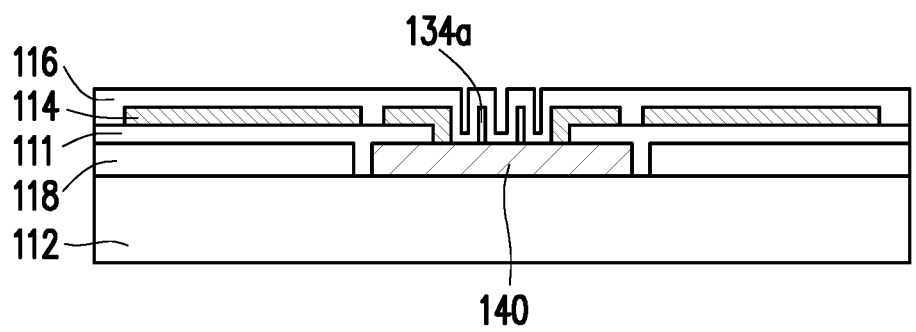

Referring to FIG. 3D, next, a first dielectric layer 116 is formed on the first electrode layer 114. In the present embodiment, the material of the first dielectric layer 116 is, for instance, Teflon, parylene, photoresist, or other polymer materials. In the present embodiment, the forming method of the first dielectric layer 116 is, for instance, thermoforming, chemical vapor deposition, physical vapor deposition, or spin coating, and the thickness and height thereof are different based on the forming method. FIG. 3D is a schematic, but the invention is not limited thereto. In the present embodiment, the step of performing surface modification on the surface of the semiconductor chip 140 can be further included to form a surface modification layer (not shown).

Next, a second component 120 is provided and the first component 110 and the second component 120 are disposed opposite to each other to form a channel layer 130 between the first component 110 and the second component 120 to form the microfluidic chip 100a shown in FIG. 1B.

Figure 5A:
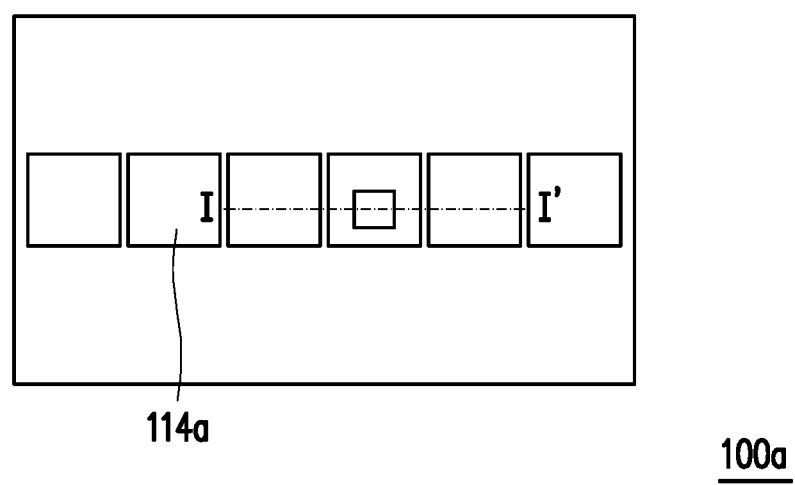
FIG. 5A shows a top view of a microfluidic chip of another embodiment of the invention.

FIG. 5A shows a top view of a microfluidic chip of another embodiment of the invention, and FIG. 5B to FIG. 5G show cross sections of the manufacturing method of t microfluidic chip along I-I' in FIG. 5A.

Figure 5B:
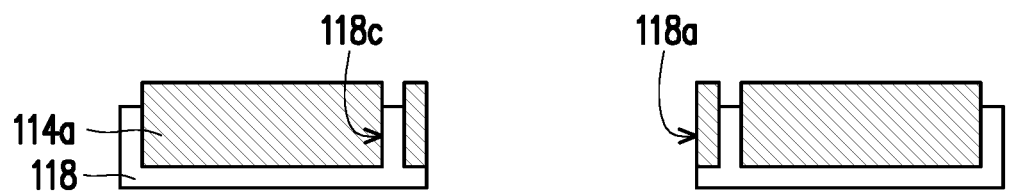
FIG. 5B to FIG. 5G show cross sections of the manufacturing method of a microfluidic chip along I-I' of FIG. 5A.

Referring to FIG. 5B, first, a third dielectric layer 118 and a first electrode layer 114 are formed. In the present embodiment, the third dielectric layer 118 includes, for instance, a second opening 118a and a plurality of grooves 118c, wherein the first electrode layer 114 is formed in the grooves 118c. In the present embodiment, the first electrode layer 114 is, for instance, partially embedded in the third dielectric layer 118 and protruded beyond one side of the third dielectric layer 118. In other embodiments, one side of the first electrode layer 114 can also be substantially coplanar with one side of the third dielectric layer 118. In the present embodiment, for instance, a plurality of grooves 118c is first formed in the third dielectric layer 118, a first electrode layer 114 is formed in the grooves 118c, and portions of the third dielectric layer 118 and the first electrode layer 114 are removed to form the second opening 118a, but the invention is not limited thereto.

Figure 5C:
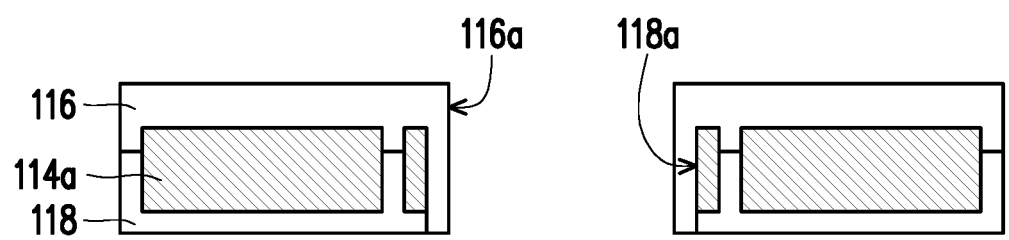

Referring to FIG. 5C, next, a first dielectric layer 116 having the first opening 116a is formed on the first electrode layer 114. In the present embodiment, the material of the first dielectric layer 116 is, for instance, a hydrophobic material such as Teflon, and the forming method of the first dielectric layer 116 is, for instance, spin coating, dip coating, or spray coating, but the invention is not limited thereto. In the present embodiment, the first dielectric layer 116 is, for instance, filled in one side of the first electrode layer 114, one side of the third dielectric layer 118, or one side of the first electrode layer 114 and the third dielectric layer 118 exposed by the gap between the first electrode layer 114 and the third dielectric layer 118.

Figure 5D:
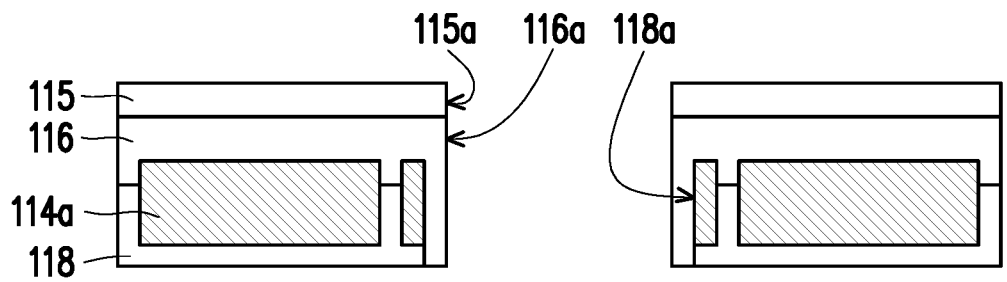

Referring to FIG. 5D, next, a protective layer 115 having a fourth opening 115a is formed on the first dielectric layer 116, wherein the protective layer 115 covers the first dielectric layer 116 and the fourth opening 115a exposes the first opening 116a. In the present embodiment, the material of the protective layer 115 is, for instance, parylene, and the forming method of the protective layer 115 is, for instance, coating or chemical vapor deposition, but the invention is not limited thereto.

Figure 5E:
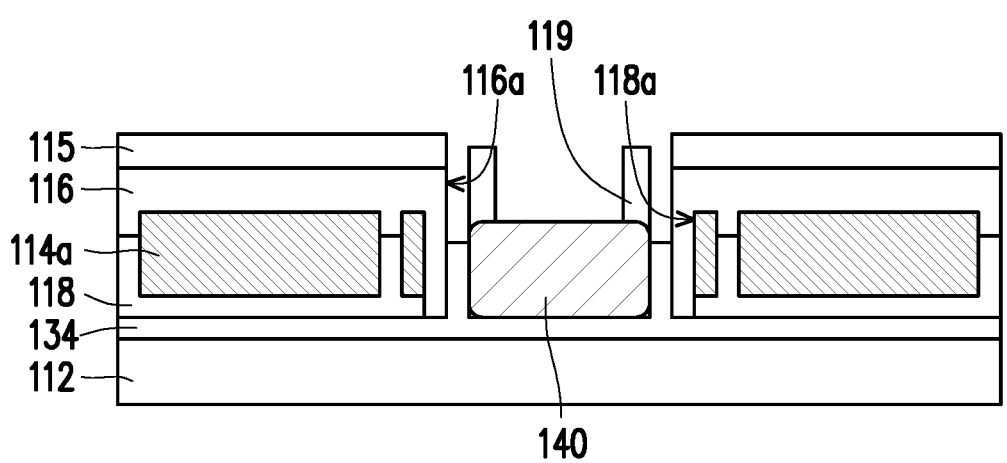

Referring to FIG. 5E, next, the semiconductor chip 140 is combined with the structure shown in FIG. 5D, wherein the semiconductor chip 140 is disposed in the first opening 116a. In the present embodiment, the semiconductor chip 140 is combined with the structure shown in FIG. 5C via the first substrate 112 having the signal conduction layer 134, and the signal conduction layer 134 is filled in the gap between the semiconductor chip 140 and the first opening 116a. Here, the blocking layer 119 is located outside of the surface of the semiconductor chip 140 to prevent the signal conduction layer 134 from contaminating or covering the surface of the semiconductor chip 140, but the invention is not limited thereto. For instance, in other embodiments, the semiconductor chip 140 can be combined with the structure shown in FIG. 5C by directly using a curable adhesive or polymer as the first substrate 112, or the semiconductor chip 140 can be combined with the structure shown in FIG. 5C by using a curable conductive adhesive or conductive polymer as both the signal conduction layer 134 and the first substrate 112 to fix the semiconductor chip 140 in the first opening 116a of the first dielectric layer 116. In the present embodiment, the semiconductor chip 140 is combined with the signal conduction layer 134 via the bottom thereof, and the semiconductor chip 140 can also be combined with the structure shown in FIG. 5C via the signal conduction layer 134 filled in the gap between the semiconductor chip 140 and the first dielectric layer 116.

Figure 5F:
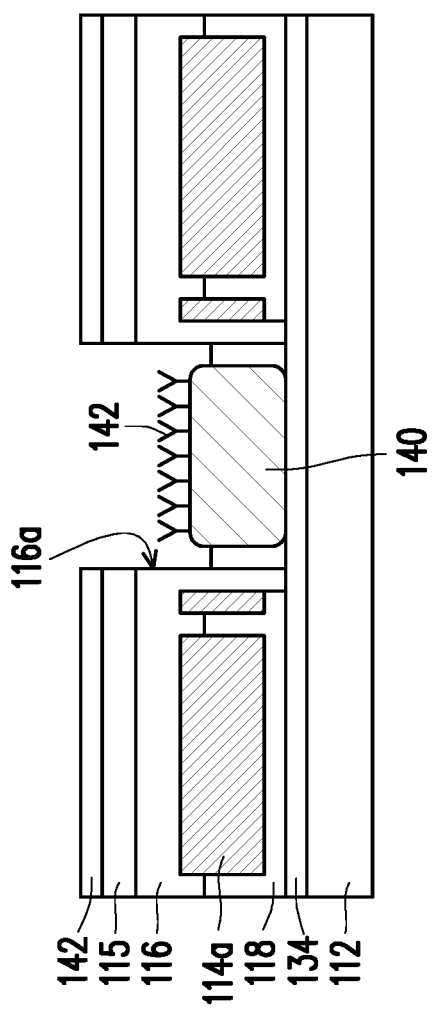

Referring to FIG. 5F, next, surface modification is performed on the surface of the semiconductor chip 140 to form a surface modification layer 142. After the microdroplet 132 entering the channel layer 130 is directly reacted with the surface modification layer 142 on the semiconductor chip 140, the signal generated by the semiconductor chip 140 is changed, and the analyte amount in the sample can be detected based on the amount of difference of the signal. For instance, an antibody layer of a specific protein is formed on the semiconductor chip 140, and if the test sample contains the specific protein, when the microdroplet 132 flows through the semiconductor chip 140, the thickness, weight, electrical properties, magnetism, or optical signal of the surface modification layer 142 may be changed after the protein and the antibody are combined, and then the object of sample detection can be achieved based on the relationship between signal change and analyte amount.

In an embodiment of the invention, the microdroplet 132 entering the channel layer 130 can also be indirectly reacted with the surface on the semiconductor chip 140 to only affect the signal on the semiconductor chip 140. In the case of collecting optical signals (not shown), when the microdroplet 132 contains a molecular compound that can absorb or emit light, the optical signal strength received by the semiconductor chip 140 is changed when the microdroplet 132 enters the channel layer 130 and reaches the surface of the semiconductor chip 140, and the amount of change thereof is related to the different amounts of the analyte in the microdroplet 132, and the analyte amount in the sample can be detected via the change in the signal strength.

Referring further to FIG. 5F, in the present embodiment, since the protective layer 115 covers the first dielectric layer 116, phenomenon such as adhesion between the first dielectric layer 116 and a substance such as an antibody used in the surface modification step can be avoided. In other words, the protective layer 115 can at least allow one side of the first dielectric layer 116 to keep the original surface properties thereof.

Figure 5G:
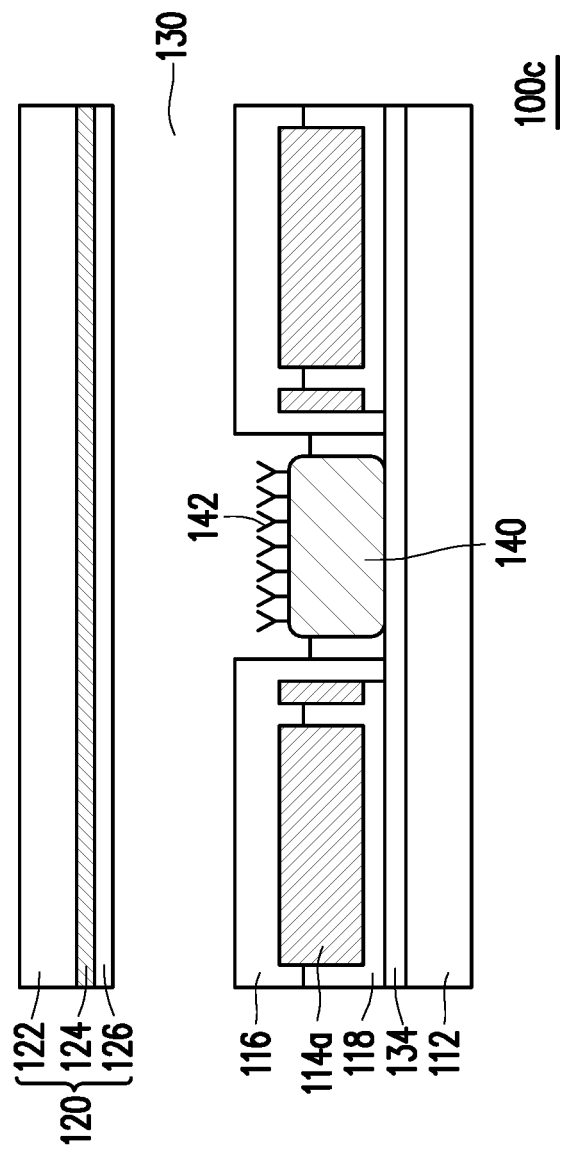

Referring to FIG. 5G, next, the protective layer 115 is removed. Next, a second component 120 is provided and the first component 110 and the second component 120 are disposed opposite to each other to form a channel layer 130 between the first component 110 and the second component 120 to form a microfluidic chip 100c. It should be mentioned that, although in the present embodiment, surface modification is performed on the surface of the semiconductor chip, in other embodiments, surface modification can also be performed on the semiconductor chip before the semiconductor chip is placed on the substrate, or the step of surface modification is omitted.

Figure 6A:
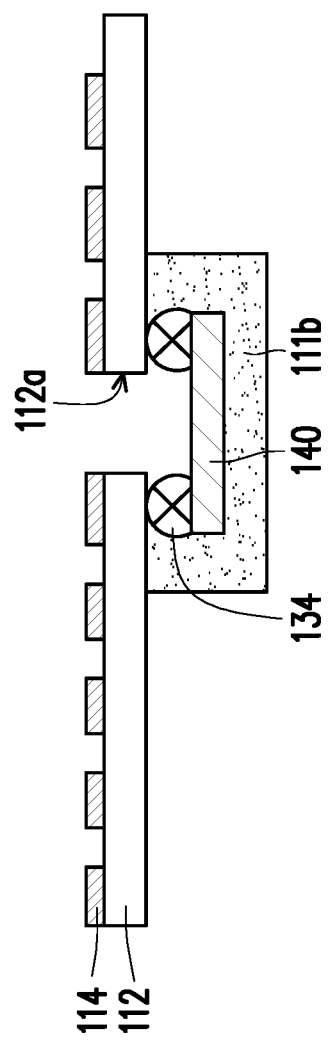
FIG. 6A to FIG. 6B show cross sections of the manufacturing method of a microfluidic chip of another embodiment of the invention.
Figure 6B:
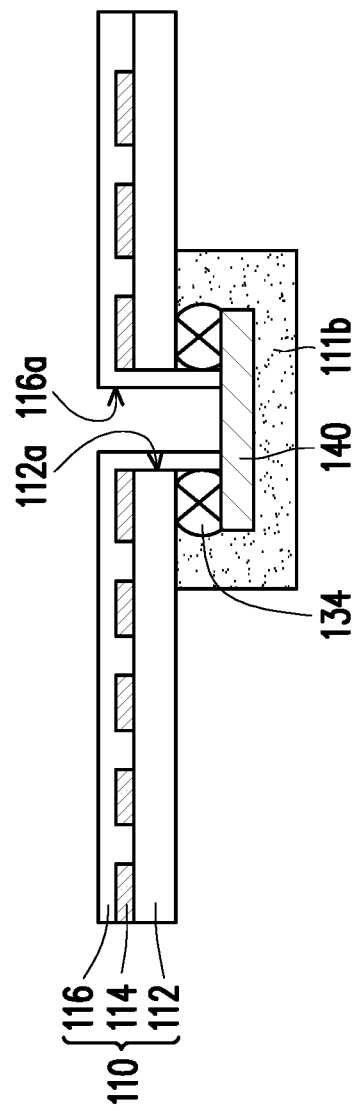

FIG. 6A to FIG. 6B show cross sections of the manufacturing method of a microfluidic chip of another embodiment of the invention.

Referring to FIG. 6A, first, a first substrate 112 having a first via 112a is provided. Next, the semiconductor chip 140 is fixed below the first via 112a of the first substrate 112 via a signal conduction layer 134 such that the semiconductor chip 140 is exposed via the first via 112a. Next, a first electrode layer 114 is formed on the first substrate 112. It should be mentioned that, in the present embodiment, the order of the steps of placing the semiconductor chip 140 and forming the first electrode layer 114 is not limited.

Referring to FIG. 6B, a first dielectric layer 116 is formed on the first substrate 112, wherein the first opening 116a exposes the semiconductor chip 140. In the present embodiment, the first dielectric layer 116 is extended and disposed on the sidewall of the first via 112a and in contact with the surface of the semiconductor chip 140, but the invention is not limited thereto. In the present embodiment, a polymer layer 111b is further formed at one side of the first substrate 112 such that the polymer layer 111b surrounds the semiconductor chip 140.

Next, a second component 120 is provided and the first component 110 and the second component 120 are disposed opposite to each other to form a channel layer 130 between the first component 110 and the second component 120 to form the microfluidic chip 100b shown in FIG. 2A. It should be mentioned that, in the present embodiment, since the semiconductor chip is combined with the first component via adhesion, the manufacture of the microfluidic chip is more convenient, and therefore the objects of simple process and increased yield are achieved.

Figure 7:
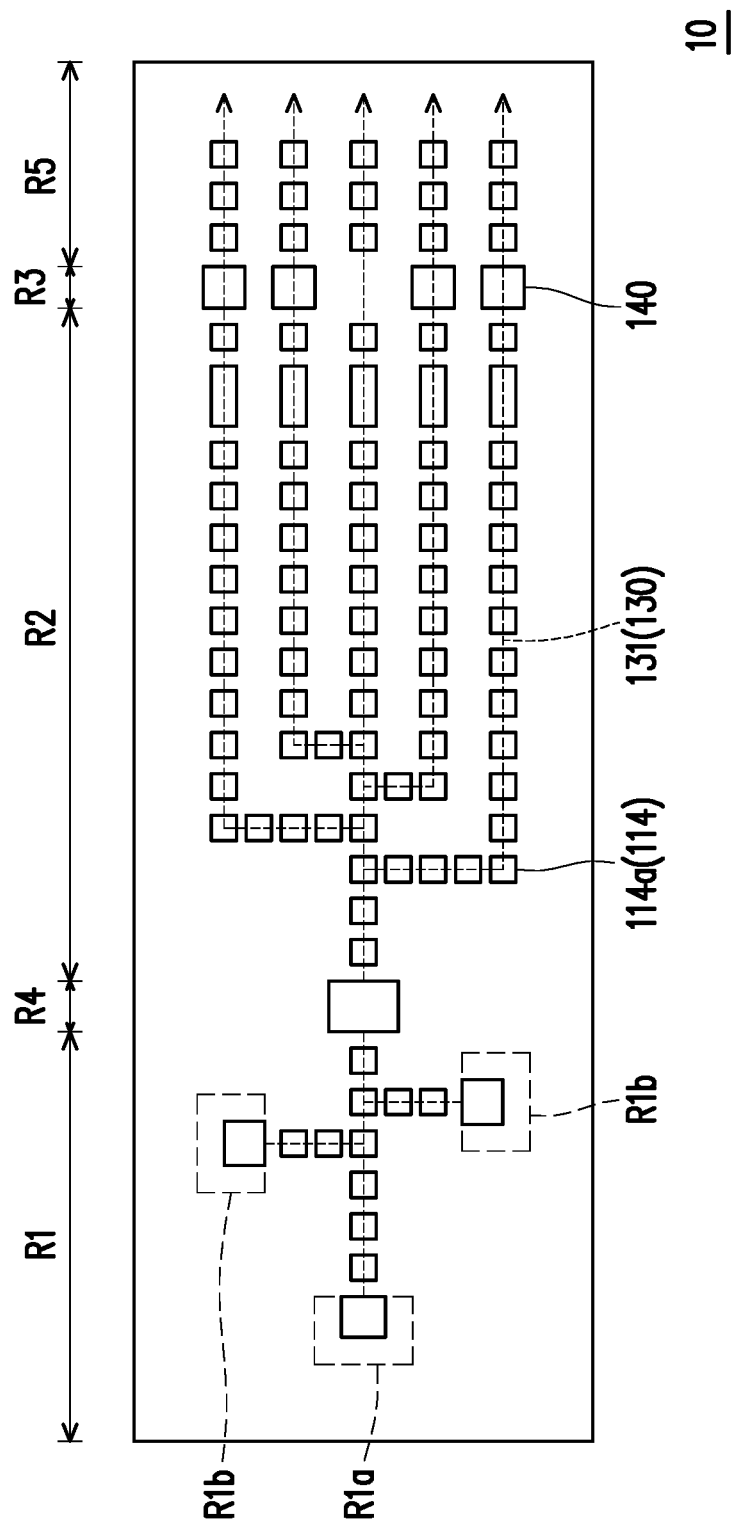
FIG. 7 shows a top view of an integrated microfluidic chip system of an embodiment of the invention.

FIG. 7 shows a top view of an integrated microfluidic chip system of an embodiment of the invention. It should be mentioned that, to clearly show the pattern design of the electrode 114a of the electrode layer 114, other members above and below the electrode layer are omitted in FIG. 7. Referring to FIG. 7, the basic structure of an integrated microfluidic chip system 10 of the present embodiment is substantially the same as that of the microfluidic chip above, and the differences are described below. The integrated microfluidic chip system 10 has a storage region R1, a channel region R2, and a detection region R3. The storage region R1 is for placing a sample or a reagent. In the present embodiment, the storage region R1 of the integrated microfluidic chip system 10 includes, for instance, a storage region R1a for placing a sample and a plurality of storage regions R1b for respectively storing different reagents, but the invention is not limited thereto. The channel layer 130 is located in the storage region R1, the channel region R2, and the detection region R3, such that the sample or reagent in the storage region R1 enters the detection region R3 via the channel region R2. The semiconductor chip 140 is located in the detection region R3.

In the present embodiment, the integrated microfluidic chip system 10, for instance, further includes a buffer region R4 and a waste liquid region R5. The buffer region R4 is located between the storage region R1 and the channel region R2, and the size of the electrode 114a in this region can be the same as that of the electrode 114a controlling the droplet or greater by several times than the electrode 114a to mix samples and reagents from a plurality of storage regions R1a and R1b. The waste liquid region R5 is adjacent to the detection region R3 for collecting the sample or the reagent from the detection of the semiconductor chip 140.

The operation process of detecting a sample using the integrated microfluidic chip system 10 is described below. First, a sample is dripped into the storage region R1a, and a reagent is dripped into the storage region R1b. Next, the sample and the reagent enter the buffer region R4 via the channel 131 to form a microdroplet mixture. In the present embodiment, the sample and the reagent are converged in a single channel flowing toward the buffer region R4 from a plurality of different channels. Next, the microdroplet mixture respectively enters different semiconductor chips 140 of the detection region R3 via a plurality of channels 131 of the channel region R2 to perform a plurality of different detections or several times of the same detection. Next, the detected sample and reagent directly enter the waste liquid region or via the channels 131. In the present embodiment, via the design of a plurality of channels, a plurality of compounds, biomarkers, or biological signatures can be detected at the same time to achieve the effects of few sample requirements, rapid detection, and simultaneous detection.

Based on the above, in the invention, a microfluidic chip technique and a semiconductor chip are integrated such that a microdroplet to be detected can flow toward a semiconductor chip via a channel layer defined by electrode layers to perform the desired detection on the microdroplet. Moreover, by designing channel paths in the channel layer, a plurality of compounds, biomarkers, or biological signals of a single sample can be detected at the same time to achieve the effects of few sample requirements, rapid detection, and simultaneous detection.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A microfluidic chip for detecting or treating a microdroplet, comprising:
a first component comprising a first substrate, a first electrode layer, and a first dielectric layer, wherein the first electrode layer is located between the first substrate and the first dielectric layer, wherein the first electrode layer comprises a plurality of electrodes, and the first dielectric layer covers a sidewall of at least one of the electrodes and is disposed between the electrodes;
a second component disposed opposite to the first component and comprising a second substrate, a second electrode layer, and a second dielectric layer, wherein the second electrode layer is located between the second substrate and the second dielectric layer;
a channel layer located between the first component and the second component and comprising at least one channel; and
a semiconductor chip disposed at one side of on the first substrate, wherein the semiconductor chip is exposed to the channel layer, and the microdroplet entering the channel layer is reacted with the semiconductor chip, wherein the first dielectric layer has a first opening, and the semiconductor chip is exposed to the channel layer via the first opening, and the microdroplet entering the channel layer is reacted with the semiconductor chip via the first opening, and
wherein the first component further comprises a third dielectric layer having a second opening, the third dielectric layer is disposed between the first electrode layer and the first substrate, and the semiconductor chip is disposed in the second opening and located on the first substrate.

2. The micro fluidic chip of claim 1, wherein the semiconductor chip is entirely disposed on the first substrate.

3. The microfluidic chip of claim 1, wherein a height of the third dielectric layer and a height of the semiconductor chip are substantially the same.

4. The microfluidic chip of claim 1, wherein the first component further comprises a polymer layer having a third opening, the polymer layer is disposed between the first electrode layer and the third dielectric layer and filled in a gap between the third dielectric layer and the semiconductor chip, and the semiconductor chip is exposed to the channel layer via the third opening.

5. The micro fluidic chip of claim 1, wherein the first substrate comprises a first via, and the semiconductor chip is exposed to the channel layer via the first via.

6. The microfluidic chip of claim 5, wherein the semiconductor chip is fixed below the first substrate via a signal conduction layer and surrounded by a polymer layer.

7. The microfluidic chip of claim 1, wherein the first electrode layer is a patterned electrode, and the patterned electrode comprises a plurality of electrodes, wherein one of the electrodes located above the semiconductor chip and one of the electrodes not located above the semiconductor chip have different sizes.

8. The microfluidic chip of claim 1 further comprising: a signal conduction layer having an electrical conduction function and used as an electrical conduction layer of the semiconductor chip and the first component; a polymer layer having a function of fixing the semiconductor chip on the first component; and a blocking layer located at one side of the semiconductor chip and having a function of preventing a material in the signal conduction layer or the polymer layer from contaminating a detection location of the semiconductor chip, wherein the polymer layer and the signal conduction layer are located at a same side of the blocking layer.

9. The microfluidic chip of claim 8, wherein the first component comprises a flexible circuit board or a member formed by a circuit board and an ITO conductive glass.

10. The microfluidic chip of claim 9, wherein the first component further comprises a carrier board and a flexible circuit layer disposed on the carrier board.

11. A manufacturing method of a microfluidic chip, comprising: providing a first component, wherein the first component comprises a first substrate, a first electrode layer, and a first dielectric layer having a first opening, and the first electrode layer is located between the first substrate and the first dielectric layer, wherein the first electrode layer comprises a plurality of electrodes, and the first dielectric layer covers a sidewall of at least one of the electrodes and is disposed between the electrodes; providing a second component, wherein the second component comprises a second substrate, a second electrode layer, and a second dielectric layer, and the second electrode layer is located between the second substrate and the second dielectric layer; disposing the first component and the second component opposite to each other and forming a channel layer between the first component and the second component; and disposing a semiconductor chip at one side of on the first substrate, wherein the semiconductor chip is exposed to the channel layer via the first opening, wherein the step of providing the first component and disposing the semiconductor chip comprises: forming a third dielectric layer having a second opening on the first substrate; disposing the semiconductor chip in the second opening on the first substrate; forming a polymer layer having a third opening on the third dielectric layer, wherein the polymer layer is filled in a gap between the third dielectric layer and the semiconductor chip, and the third opening exposes the semiconductor chip; forming the first dielectric layer on the polymer layer; forming a signal conduction layer on the semiconductor chip; and forming the first dielectric layer on the first electrode layer and the signal conduction layer, wherein the first opening exposes the semiconductor chip.

12. The manufacturing method of the microfluidic chip of claim 11, wherein the step of providing the first component and disposing the semiconductor chip comprises: providing the first substrate having a first via; fixing the semiconductor chip below the first via of the first substrate via a signal conduction layer, wherein the semiconductor chip is exposed via the first via; forming the first electrode layer on the first substrate; and forming the first dielectric layer on the first substrate, wherein the first opening exposes the semiconductor chip.

13. The manufacturing method of the microfluidic chip of claim 12, further comprising surrounding the semiconductor chip by a polymer layer.

14. A manufacturing method of a microfluidic chip, comprising: providing a first component, wherein the first component comprises a first substrate, a first electrode layer, and a first dielectric layer having a first opening, and the first electrode layer is located between the first substrate and the first dielectric layer, wherein the first electrode layer comprises a plurality of electrodes, and the first dielectric layer covers a sidewall of at least one of the electrodes and is disposed between the electrodes; providing a second component, wherein the second component comprises a second substrate, a second electrode layer, and a second dielectric layer, and the second electrode layer is located between the second substrate and the second dielectric layer; disposing the first component and the second component opposite to each other and forming a channel layer between the first component and the second component; and disposing a semiconductor chip at one side of on the first substrate, wherein the semiconductor chip is exposed to the channel layer via the first opening, wherein the step of providing the first component and disposing the semiconductor chip comprises: forming a third dielectric layer having a second opening and a plurality of grooves; forming the first electrode layer in the grooves; forming the first dielectric layer having the first opening on the third dielectric layer to cover the first electrode layer; forming a protective layer having a fourth opening on the first dielectric layer, wherein the protective layer covers the first dielectric layer and the fourth opening exposes the third opening; combining the first substrate on which the semiconductor chip is disposed and the first dielectric layer such that the semiconductor chip is located in the first opening; forming a surface modification layer on a surface of the semiconductor chip; and removing the protective layer.

15. The manufacturing method of the microfluidic chip of claim 14, wherein a method of combining the first substrate on which the semiconductor chip is disposed and the first dielectric layer comprises attaching the first substrate on the third dielectric layer via a signal conduction layer.

16. The manufacturing method of the micro fluidic chip of claim 14, wherein a method of combining the first substrate on which the semiconductor chip is disposed and the first dielectric layer comprises fixing the semiconductor chip in the first opening by using a curable adhesive as the first substrate.

17. An integrated microfluidic chip system having at least one storage region, one channel region, and a detection region, wherein the storage region is for placing a sample or a reagent, the channel region is located between the storage region and the detection region, and the integrated microfluidic chip system comprises:

a first component comprising a first substrate, a first electrode layer, and a first dielectric layer having a first opening, wherein the first electrode layer is located between the first substrate and the first dielectric layer, the first electrode layer comprises a plurality of electrodes, and the first dielectric layer covers a sidewall of at least one of the electrodes and is disposed between the electrodes;

a second component disposed opposite to the first component and comprising a second substrate, a second electrode layer, and a second dielectric layer, wherein the second electrode layer is located between the second substrate and the second dielectric layer;

a channel layer located between the first component and the second component such that the sample or the reagent in the storage region enters the detection region via the channel region;

a semiconductor chip located in the detection region and disposed at one side of on the first substrate, wherein the semiconductor chip is exposed to the channel layer via the first opening, and the microdroplet entering the channel layer is reacted with the semiconductor chip via the first opening; and a waste liquid region, wherein the waste liquid region is adjacent to the detection region for collecting the sample or the reagent from a detection of the semiconductor chip, wherein the first component further comprises a third dielectric layer having a second opening, the third dielectric layer is disposed between the first electrode layer and the first substrate, and the semiconductor chip is disposed in the second opening and located on the first substrate.

18. The integrated micro fluidic chip system of claim 17, further comprising a buffer region, wherein the buffer region is located between the storage region and the channel region for mixing the sample and the reagent.

* * * * *